US012628408B2

(12) United States Patent
Yamaguchi

(10) Patent No.: US 12,628,408 B2
(45) Date of Patent: May 12, 2026

(54) METAL FILM AND MANUFACTURING METHOD OF THE METAL FILM, AND SEMICONDUCTOR DEVICE AND METHOD OF MANUFACTURING THE SEMICONDUCTOR DEVICE

(71) Applicant: RENESAS ELECTRONICS CORPORATION, Tokyo (JP)

(72) Inventor: Tadashi Yamaguchi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 399 days.

(21) Appl. No.: 18/303,983

(22) Filed: Apr. 20, 2023

(65) Prior Publication Data

US 2023/0411320 A1 Dec. 21, 2023

(30) Foreign Application Priority Data

Jun. 10, 2022 (JP) .................................. 2022-094618

(51) Int. Cl.
| | |
|---|---|
| *H10D 64/62* | (2025.01) |
| *H10D 64/01* | (2025.01) |
| *H10W 72/00* | (2026.01) |
| *H10W 72/59* | (2026.01) |
| *H10W 72/90* | (2026.01) |
| *H10W 90/00* | (2026.01) |

(52) U.S. Cl.
CPC ............. *H10D 64/62* (2025.01); *H10D 64/01* (2025.01); *H10W 72/019* (2026.01); *H10W 72/07554* (2026.01); *H10W 72/59* (2026.01); *H10W 72/884* (2026.01); *H10W 72/944* (2026.01); *H10W 72/952* (2026.01); *H10W 90/736* (2026.01); *H10W 90/756* (2026.01)

(58) Field of Classification Search
CPC . H01L 2224/04042; H01L 2224/05624; H01L 2224/05647
See application file for complete search history.

(56) References Cited

U.S. PATENT DOCUMENTS 5,843,840 A 12/1998 Miyazaki et al.

FOREIGN PATENT DOCUMENTS

| JP | 02-153544 A | 6/1990 |
|---|---|---|
| JP | H08-241895 A | 9/1996 |
| JP | 2007-165663 A | 6/2007 |

OTHER PUBLICATIONS

Koneva et al., (Internal long-Range Stress Fields in Ultrafine Gained Materials, ResearchGate, Jan. 2005). (Year: 2005).*

(Continued)

*Primary Examiner* — Samuel A Gebremariam
(74) *Attorney, Agent, or Firm* — Rimon P.C.

(57) ABSTRACT

A metal film, a manufacturing method of the metal film, semiconductor device, and a manufacturing method of semiconductor device are provided with high crack resistance (higher hardness) during wire bonding. The Metal film has first metal crystal grains, and the second metal crystal grains. Each of the first metal crystal grains has dislocations. Each of the second metal crystal grains has no dislocations. The number of the first metal crystal grains having the dislocations is larger than the number of the second metal crystal grains having no dislocations.

8 Claims, 14 Drawing Sheets

(56) References Cited

OTHER PUBLICATIONS

Harper et al., Microstructure control in semiconductor metalliza-
tion, Journal of Vacuum Science and Technology B 15, 763-779, Jul.
1, 1997 (Year: 1997).*
Office Action dated Jul. 29, 2025, issued in corresponding Japan
Patent Application No. 2022-094618, 10 pages.

* cited by examiner

METAL FILM AND MANUFACTURING METHOD OF THE METAL FILM, AND SEMICONDUCTOR DEVICE AND METHOD OF MANUFACTURING THE SEMICONDUCTOR DEVICE

CROSS-REFERENCE TO RELATED APPLICATIONS

The disclosure of Japanese Patent Application No. 2022-094618 filed on Jun. 10, 2022, including the specification, drawings and abstract is incorporated herein by reference in its entirety.

BACKGROUND

The present invention relates to a metal film, a method for manufacturing the metal film, a semiconductor device, and a method for manufacturing the semiconductor device.

In Japanese Unexamined Patent Application Publication No. 2007-165663 (Patent Document 1), a stress relaxing film is formed on a conductive film in order to reduce a warpage of a semiconductor wafer. The conductive film becomes as a gate pad or a source pad, and is made of aluminum (Al) or the like. The conductive film is formed by sputtering.

SUMMARY

The aluminum pads are required to have high crack resistance (high hardness) during wire bonding.

Other objects and novel features will become apparent from the description of this specification and the accompanying drawings.

According to an embodiment of a metal film, a number of first metal grains having dislocations is larger than a number of second metal grains having no dislocations.

The semiconductor device according to an embodiment includes the metal film as a bonding pad or a wiring.

According to the metal film according to a manufacturing method of the embodiment, the dislocations is formed in the metal film by performing annealing in which metal grains recrystallize after point defects are introduced into the metal film.

According to manufacturing method of the semiconductor device according to an embodiment, the metal film is formed as the bonding pad or the wiring.

According to the above-described embodiment, the metal film having high crack resistance (high hardness) during wire bonding, a method for manufacturing the metal film, the semiconductor device including the metal film, and a method for manufacturing the semiconductor device are realized.

BRIEF DESCRIPTION OF THE DRAWINGS

FIG. 5 is a cross-sectional view illustrating a second step of the manufacturing method of the metal film according to the embodiment.

FIG. 7 is a plan view showing a configuration of a photoresist mask for a selectively ion-implantation the region to be wire bonded.

FIG. 14 shows a degree of relaxation of an inner stress of the metal film by ion-implantation.

DETAILED DESCRIPTION

Figure 1:
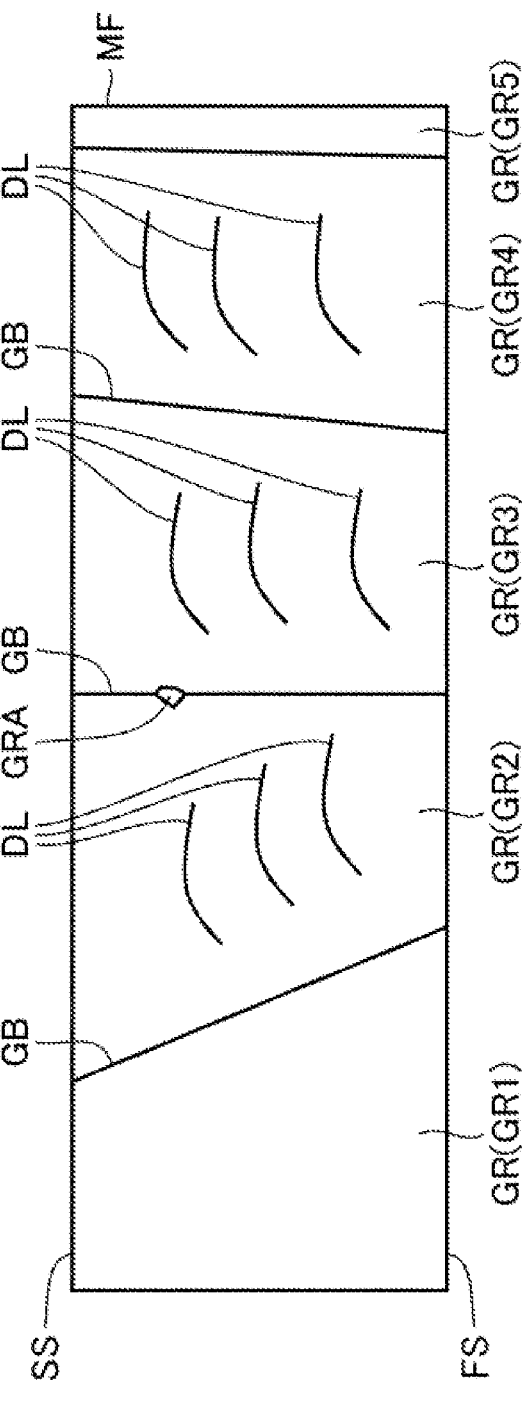
FIG. 1 is a cross-sectional view showing a configuration of a metal film according to an embodiment.

Hereinafter, embodiments of the present disclosure will be described in detail with reference to the drawings. In the specification and drawings, the same or corresponding components are denoted by the same reference numerals, and a repetitive description thereof is not repeated. In the drawings, for convenience of explanation, the configuration or manufacturing method may be omitted or simplified.

Note that a plan view in this specification means a viewpoint viewed from a direction perpendicular to a first surface FS of a semiconductor substrate. A planar shape also means a shape in plan view. Also, an opening area means an area of the opening in plan view.

(Structure of a Metal Film)

First, a configuration of a metal film according to an embodiment will be described with reference to FIG. 1.

As shown in FIG. 1, the metal film MF is made of a material containing at least one selected from the group consisting of aluminum, tungsten (W), copper (Cu), cobalt (Co), and nickel (Ni). The metal film MF is made of a material containing, for example, aluminum, pure aluminum, an alloy of aluminum and silicon (Si), an alloy of aluminum and copper, or an alloy of aluminum, silicon and copper. The metal film MF has a thickness of, for example, 1 micrometer or more and 4 micrometers or less.

The metal film MF has a plurality of metal crystal grains GR. The plurality of metal crystal grains GR includes first metal crystal grains GR2, GR3 and GR4 having dislocations DL and second metal crystal grains GR1 and GR5 having no dislocations DL. The number the first metal crystal grains GR2, GR3 and GR4 having dislocations DL is greater than the number of the second metal crystal grains GR1 and GR5 having no dislocations DL.

The metal film MF has the first surface FS and a second surface SS facing each other. Each of the plurality of metal crystal grains GR extends from the first surface FS toward the second surface SS and reaches the second surface SS. The density of dislocations DL in each of the first metal crystal grains GR2, GR3 and GR4 is 60 particles/square micrometer or more. Further, the density of dislocations DL in each of the first metal crystal grains GR2, GR3 and GR4 may be 75 particles/square micrometer or more.

A mean crystal grain size of the plurality of the metal crystal grains GR is 1 micrometer or more and 5 micrometers or less. The mean crystal grain size of the plurality of the metal crystal grains GR may be 1.7 micrometers or less. A hardness of the metal film MF is 0.96 GPa or more. The hardness of the metal film MF may be 1.17 GPa or more.

The metal film MF may have third metal crystal grains GRA. The third metal crystal grains GRA are located on grain boundaries GB of the metal crystal grains GR. The third metal crystal grain GRA may be arranged apart from both the first surface FS and the second surface SS of the metal film MF. One third metal crystal grain GRA may be located on one grain boundary GB, and the plurality of third metal crystal grains GRA may be located on the one grain boundary GB. In addition, the third metal crystal grain GRA may be located on each of the grain boundaries GB.

The third metal crystal grains GRA are made of a material other than the first metal crystal grains GR2, GR3 and GR4, and the second metal crystal grains GR1 and GR5. When each of the first metal crystal grains GR2, GR3 and GR4, and the second metal crystal grains GR1 and GR5 are made of a material containing aluminum, the third metal crystal grains GRA may be made of, for example, a material containing silicon or copper. (Configuration of the semiconductor device) Next, the semiconductor device having the metal film MF of the present embodiment will be described with reference to FIG. 2 and FIG. 3 by exemplifying a configuration of an IGBT.

Figure 2:
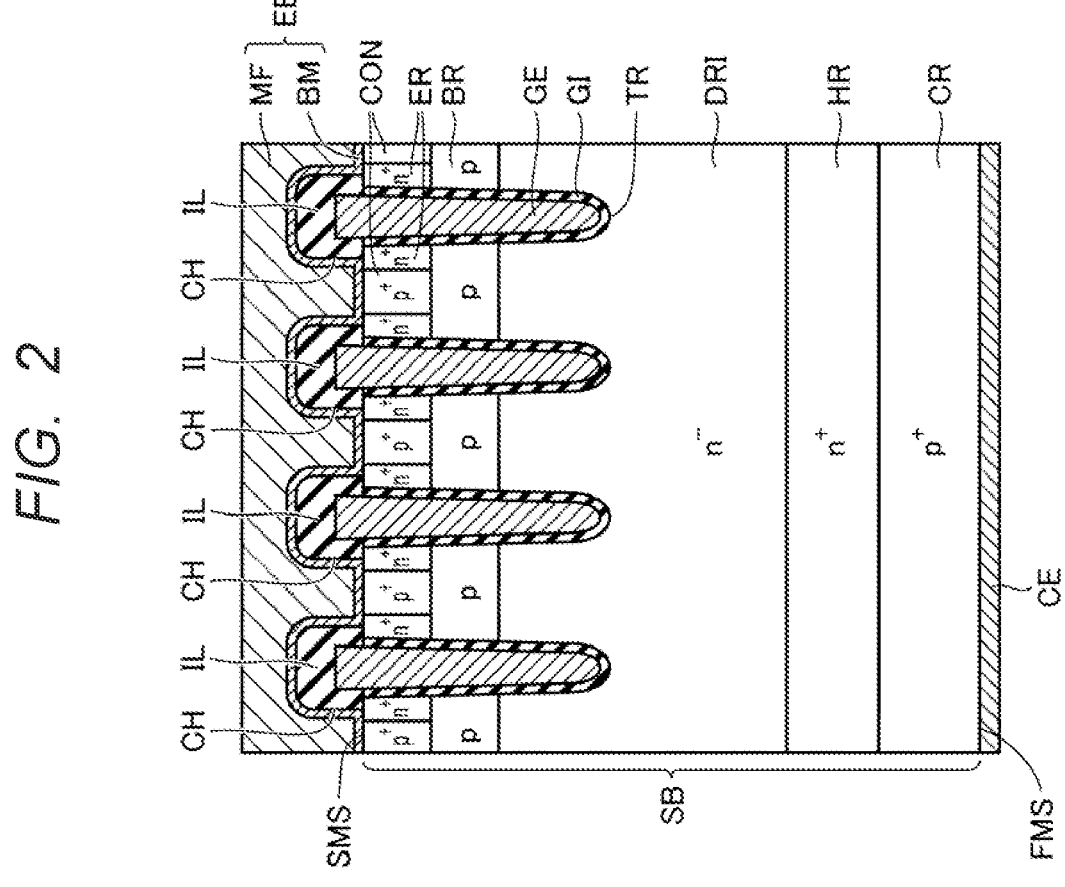
FIG. 2 is a cross-sectional view showing a configuration of a IGBT (Isolated Gate Bipolar Transistor) having the metal film shown in FIG. 1.

As shown in FIG. 2, an electric element formed in the semiconductor substrate SB is, for example, the IGBT. The IGBT mainly includes a p+ collector region CR, a n+ region HR, a n-drift region DRI, a p-type base region BR, a p+ contact region CON, a n+ emitter region ER, and a gate electrode GE.

The p+ collector region CR is arranged on a first main surface FMS of the semiconductor substrate SB. The n+ region HR is arranged on the p+ collector region CR (on a second main surface SMS with respect to the p+ collector region CR). The n+ region HR configures a pn junction with the p+ collector region CR.

A n– drifting region DRI is arranged on the n+ region HR (on the second main surface SMS with respect to the n+ region HR). the n– drift-region DRI is in contact with the n+ region HR. the n– drift-region DRI has an n-type impurity concentration lower than the n-type impurity concentration of the n+ region HR.

The p-type base-region BR is arranged on the n– drift-region DRI (the second main surface SMS side with respect to n– drift-region DRI). The p-type base-region BR configures the pn junction with the n– drift-region DRI.

The p+ contact region CON and the n+ emitter region ER are arranged on the p-type base region BR (on the second main surface SMS side with respect to the p-type base region BR). Each of the p+ contact region CON and the n+ emitter region ER is arranged on the second main surface SMS of the semiconductor substrate SB.

The p+ contact region CON is in contact with the p-type base region BR. The p+ contact region CON has a p-type impurity concentration higher than a p-type impurity concentration of the p-type base region BR. The n+ emitter region ER configures the pn junction with each of the p+ contact region CON and the p-type base region BR.

A trench TR is formed in the semiconductor substrate SB. The trench TR penetrates through each of the n+ emitter region ER and the p-type base region BR from the second main surface SMS and reaches the n– drift region DRI. A gate dielectric layer GI is arranged along an inner wall of the trench TR. An inside of the trench TR is filled with the gate electrode GE. The gate electrode GE faces the p-type base region BR via the gate dielectric layer GI. Thus, the IGBT has an insulated gate field effect transistor portion.

An emitter electrode EE is arranged so as to be electrically connected to each of the n+ emitter region ER and the p+ contact region CON via a contact hole CH of an interlayer insulating layer IL. The emitter electrode EE includes a barrier metal layer BM and the metal film MF. The barrier metal layer BM is in contact with the n+ emitter region ER and the p+ contact region CON via the contact hole CH. The metal film MF is in contact with the barrier metal layer BM.

A collector electrode CE is arranged on the first main surface FMS of the semiconductor substrate SB. The collector electrode CE is electrically connected to the p+ collector region CR by being in contact with the p+ collector region CR.

The metal film MF shown in FIG. 1 is used, for example, as the metal film MF of the IGBT shown in FIG. 2. The metal film MF shown in FIG. 2 functions as an emitter pad (bonding pad) and a wiring in the IGBT. For this purpose, the metal film MF shown in FIG. 1 is used as the bonding pad and the wiring in the IGBT shown in FIG. 2. And the metal film MF shown in FIG. 1 may also be used for other bonding pads such as a gate pad and other wiring in the IGBT.

Figure 3:
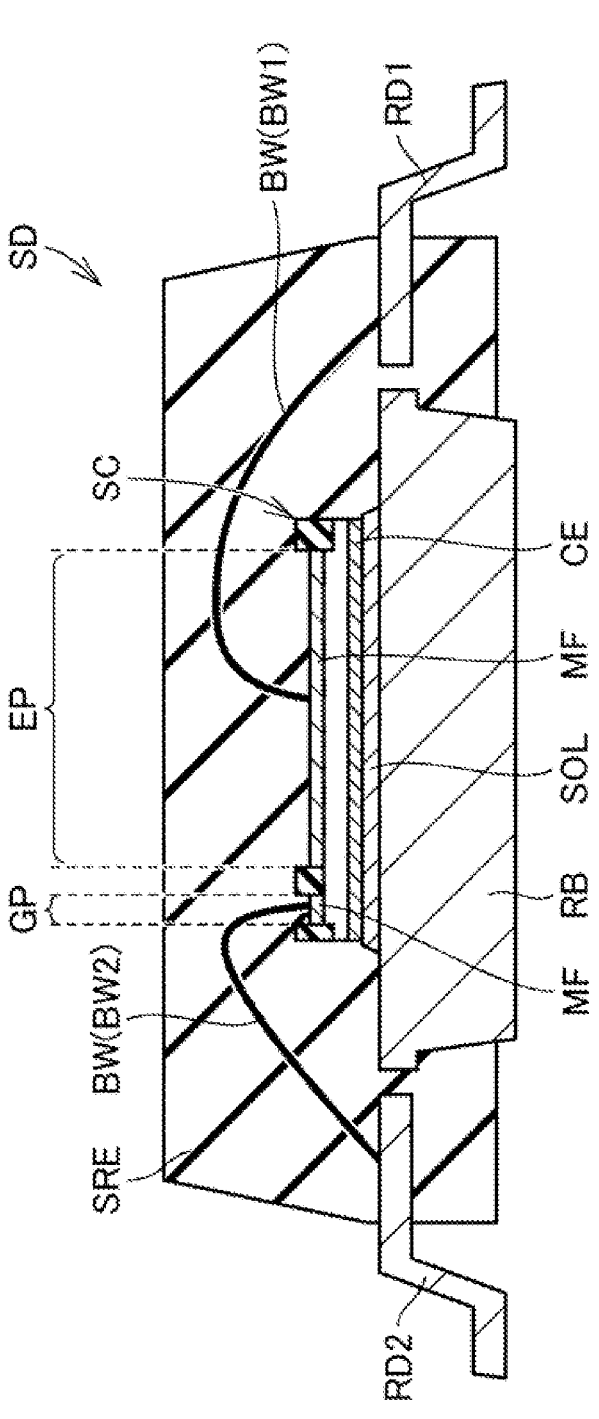
FIG. 3 is a cross-sectional view showing a configuration of a semiconductor package having the IGBT shown in FIG. 2.

In addition to the IGBT shown in FIG. 2, the metal film MF shown in FIG. 1 may be used for a bonding pad such as a source pad, the gate pad and a wiring of a power MOSFET (Metal Oxide Semiconductor Field Effect Transistor) As shown in FIG. 3, the semiconductor device SD according to the present embodiment is, for example, a semiconductor package in which a semiconductor chip SC is sealed with a sealing resin SRE. The semiconductor device SD of the present embodiment includes a chip mounting portion RB, the semiconductor chip SC, lead portions RD1 and RD2, bonding wires BW (BW1, BW2) and the sealing resin SRE.

The semiconductor chip SC has the IGBT and the metal film MF shown in FIG. 2. The semiconductor chip SC has the emitter pad EP electrically connected to the n+ emitter region ER of the IGBT (FIG. 2) and the gate pad GP electrically connected to the gate electrode GE of the IGBT. Each of the emitter pad EP and the gate pad GP is configured by the metal film MF shown in FIG. 1.

The semiconductor chip SC is mounted on the chip mounting portion RB with a solder SOL interposed therebetween. Each of the lead portions RD1 and RD2 is arranged spaced apart from the chip mounting portion RB. The bonding wire BW1 electrically connects the emitter pad EP of the semiconductor chip SC and the lead portion RD1. Although only one bonding wire BW1 is shown for simplicity of illustration, a plurality of bonding wires BW1 may be connected between the emitter pad EP and the lead portion RD1. The bonding wire BW2 electrically connects the gate pad GP of the semiconductor chip SC and the lead portion RD2.

The sealing resin SRE seals the chip mounting portion RB, the semiconductor chip SC, the lead portions RD1 and RD2, a clip conductor CC, and the bonding wires BW (BW1, BW2). A part of each of the chip mounting portion RB and the lead portions RD1 and RD2 is exposed from the sealing resin SRE. The sealing resin SRE is made of, for example, a thermosetting resin material, and may include, for example, a filler (for example, a filler made of silica particles).

(A Manufacturing Method of the Metal Film and the Semiconductor Device)

Next, a manufacturing method of the metal film and the semiconductor device according to a present embodiment will be described with reference to FIG. 4 to FIG. 6.

Figure 4:
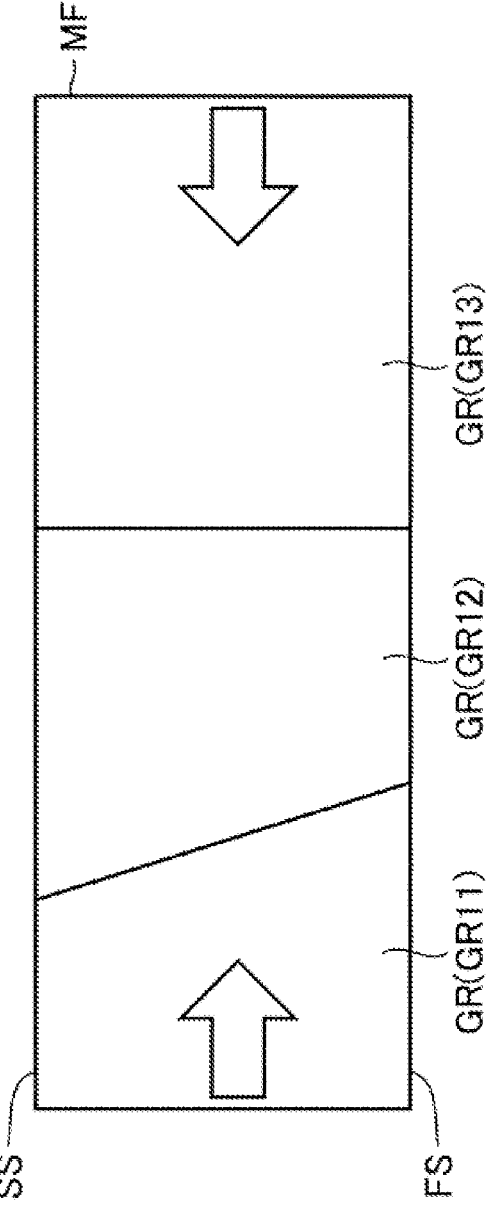
FIG. 4 is a cross-sectional view illustrating a first step of a manufacturing method of the metal film according to the embodiment.

As shown in FIG. 4, the metal film MF made of a material containing at least one selected from the group consisting of aluminum, tungsten, copper, cobalt, and nickel is formed. The metal film MF is formed of a material including, for example, aluminum, pure aluminum, an alloy of aluminum and silicon, an alloy of aluminum and copper, or an alloy of aluminum, silicon, and copper.

The metal film MF is formed by, for example, sputtering. The metal film MF is formed to have a thickness of, for example, 1 micrometer or more and 4 micrometers or less. The metal film MF is formed to have a plurality of metal crystal grains GR. Large internal stress is generated inside the metal film MF.

Figure 5:
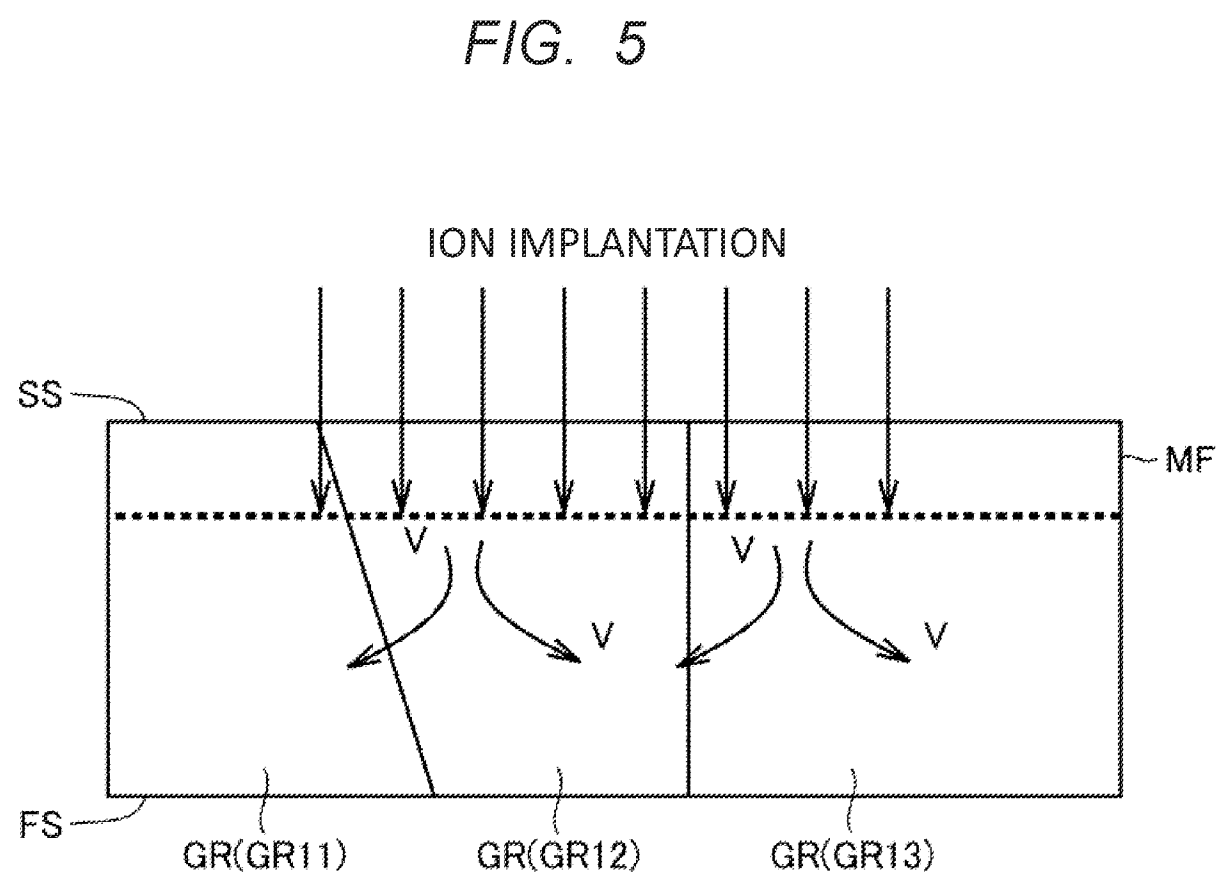

As shown in FIG. 5, for example, vacancies V are introduced as the point defects in the metal film MF. It is believed that the vacancies V introduced into the metal film MF diffuse due to the large inner stresses in the metal film MF.

The vacancies V are introduced, for example, by an ion-implantation of metal ions into the metal film MF. The ion-implantation is performed, for example, at a dose of $1\times10^{16}$ cm$^{-2}$ or more and less than $1\times10^{18}$ cm$^{-2}$. An implantation energy of the ion-implantation is, for example, 100 keV or more, but can be appropriately changed in accordance with an implantation depth or the like. The metal ions to be ion-implanted are, for example, any one or any combination of aluminum, silicon, copper, tungsten, cobalt and nickel.

The vacancies V may be introduced, for example, by irradiating the metal film MF with an electron-beam. The vacancies V may also be introduced into the metal film MF by a combination of the ion-implantation and electron-beam illumination.

Figure 6:
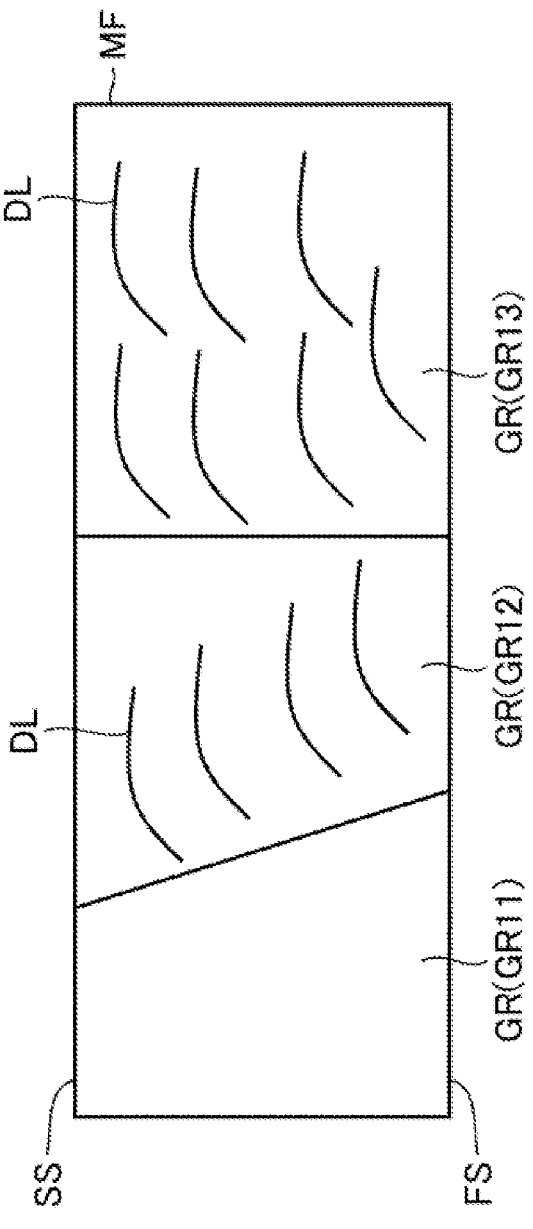
FIG. 6 is a cross-sectional view illustrating a third step of the manufacturing method of the metal film according to the embodiment.

As shown in FIG. 6, annealing is performed on the metal film MF after the introduction of the point defects (vacancies V). This annealing is performed, for example, in an atmosphere of an inert gas at a heating temperature of 300 degrees Celsius or higher and 400 degrees Celsius. or lower for a heating time of less than 2 hours. Annealing recrystallizes a plurality of the metal crystal grains GR of the metal film MF. Recrystallization of the metal crystal grains GR generates dislocations DL in the metal film MF.

Although the metal film MF is plastically deformed by the above-mentioned annealing, it is considered that a plastic deformation is accelerated by the point defects (vacancies V), so that the vacancies V are gathered in some metal crystal grains and dislocations DL are generated.

As a result, a second metal crystal grain GR11 having no dislocations DL and first metal crystal grains GR12 and GR13 having the dislocations DL are formed in the plurality of metal crystal grains GR. In addition, a number of the first metal crystal grains GR12 and GR13 having the dislocations DL is larger than the number of the second metal crystal grain GR11 having no dislocations DL.

The metal film MF of the present embodiment is manufactured by the above-described steps. Note that, in the ion-implantation of FIG. 5, for example, silicon or the like is implanted into the metal film MF made of a material containing aluminum. In this case, the implanted silicon or the like is diffused by the heat and the implantation energy during the ion-implantation. The diffused silicon or the like diffuses to the grain boundaries GB of the metal crystal grains GR as shown in FIG. 1 and precipitates as the third metal crystal grains GRA.

In addition, the ion-implantation shown in FIG. 5 may be performed on an entire surface of the metal film MF, or may be performed only on some regions of the metal film MF. The ion-implantation may be selectively performed at a portion where the bonding wires BW are connected to the metal film MF, for example.

Figure 7:
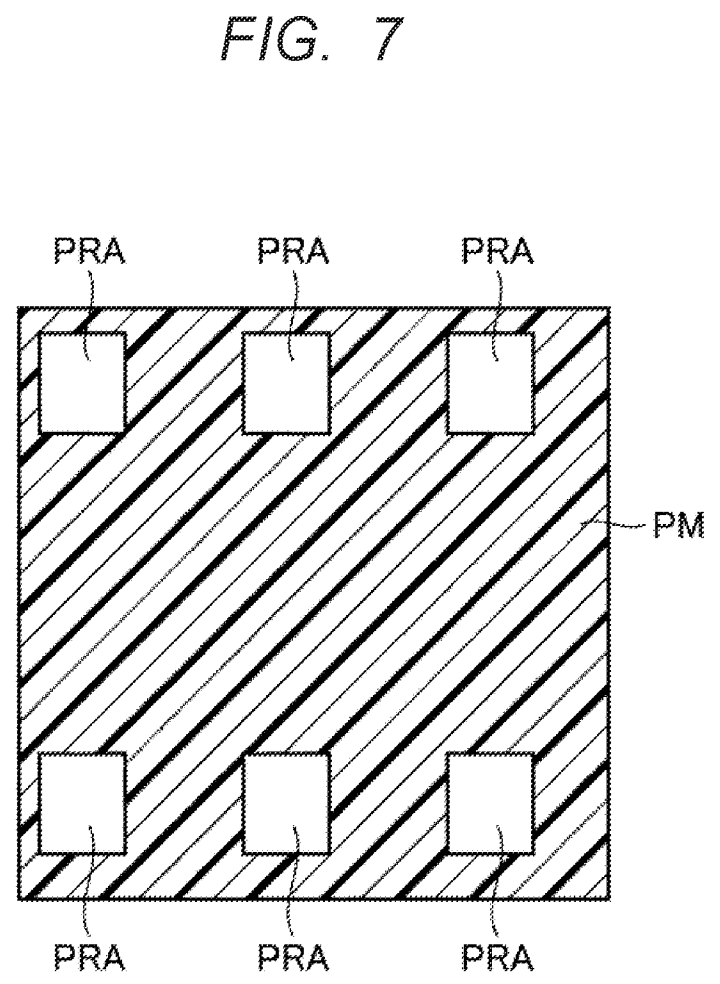

In this case, as shown in FIG. 7, the ion-implantation is performed with a photoresist mask PM formed on the metal film MF. The photoresist mask PM has a plurality of openings PRA that expose the front face of the metal film MF. Each of the plurality of openings PRA have, for example, a rectangular planar shape. Each of the plurality of openings PRA may have, for example, a circular planar shape. The opening area of each of the plurality of openings PRA may be the same as or different from each other.

The surface of the metal film MF exposed by the openings PRA are where the bonding wires BW are connected. By performing the above-described annealing after at least ion-implantation at a portion where the bonding wires BW are connected, a portion where the bonding wires BW are connected can be locally cured, and crack resistance can be improved.

When the ion-implantation is selectively performed in this manner, in regions of the metal film MF where the ion-implantation is selectively performed, a number of metal grains having the dislocations DL is larger than a number of metal grains having no dislocations DL. On the other hand, when the ion-implantation is performed on an entire surface of the metal film MF, the number of metal crystal grains having the dislocations DL is larger than the number of metal crystal grains having no dislocations DL in the entire metal film MF.

The semiconductor device shown in FIG. 2 is manufactured using a manufacturing method of the metal film MF of the present embodiment. For example, the semiconductor device shown in FIG. 2 is manufactured by forming the metal film MF of the present embodiment as the bonding pad or the wiring.

Specifically, as shown in FIG. 2, for example, the IGBT is formed in the semiconductor substrate SB. After the IGBT is formed, the interlayer insulating layer IL is formed on the second main surface SMS of the semiconductor substrate SB. In the interlayer insulating layer IL, the contact hole CH is formed by a photolithography technique and an etching technique. The contact hole CH is formed so as to expose the respective surfaces of the n+ emitter region ER and the p+ contact region CON. Although not shown in the drawings, the contact hole CH exposing a part of the gate electrode GE is also formed in the interlayer insulating layer IL.

The barrier metal layer BM is formed on the interlayer insulating layer IL so as to be in contact with each of the n+ emitter region ER and the p+ contact region CON through the contact hole CH. And the barrier metal layer BM in contact with the gate electrode GE through the contact hole CH is also formed. The metal film MF to become as the wiring and the bonding pad (emitter pad or gate pad) is formed so as to be in contact with the barrier metal layer BM. This metal film MF is the metal film MF manufactured by the process shown in FIGS. 4 to 6.

Effect

Next, the effect of the present embodiment will be described together with the findings found out by the inventor of the present disclosure.

First, the inventor of the present disclosure formed the metal film MF made of aluminum and copper (AlCu) by sputtering, prepared a sample without performing the ion-implantation on the metal film MF and a sample with the ion-implantation, and observed their cross-sections.

Figure 8:
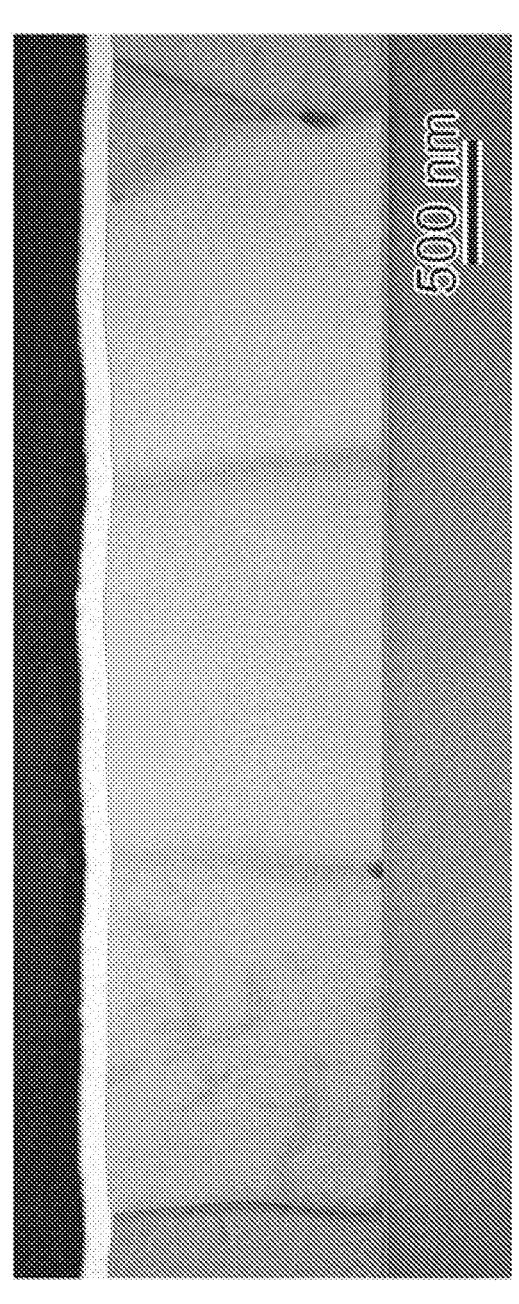
FIG. 8 is a cross-sectional view of the metal film according to a comparative embodiment not performed to the ion-implantation.
Figure 9:
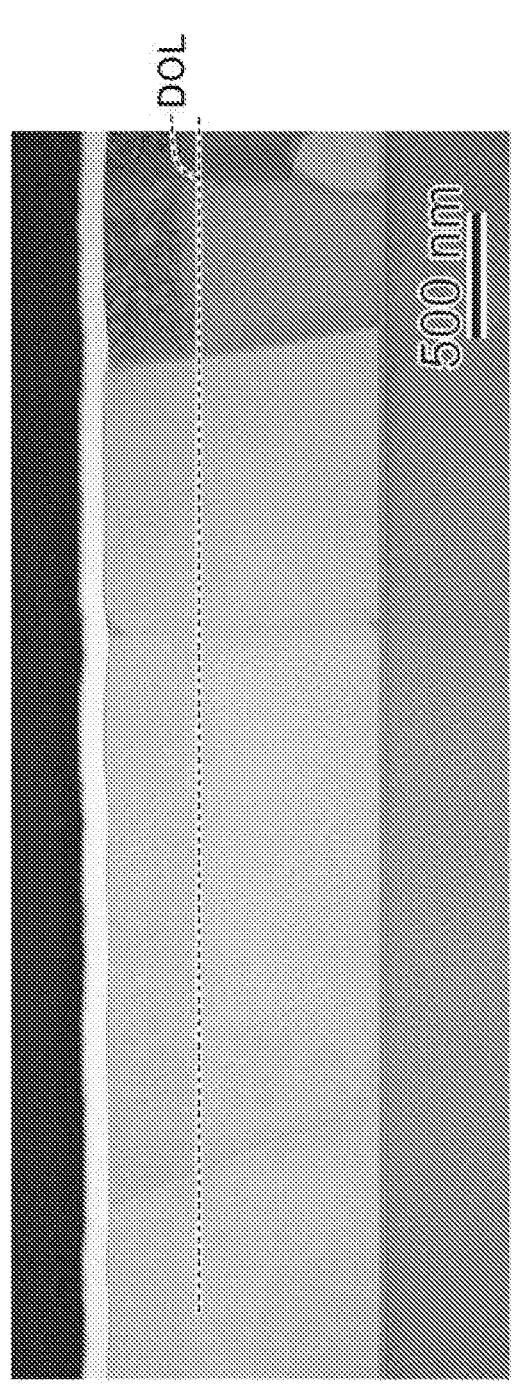
FIG. 9 is a cross-sectional view of the metal film performed to the ion-implantation with aluminum.
Figure 10:
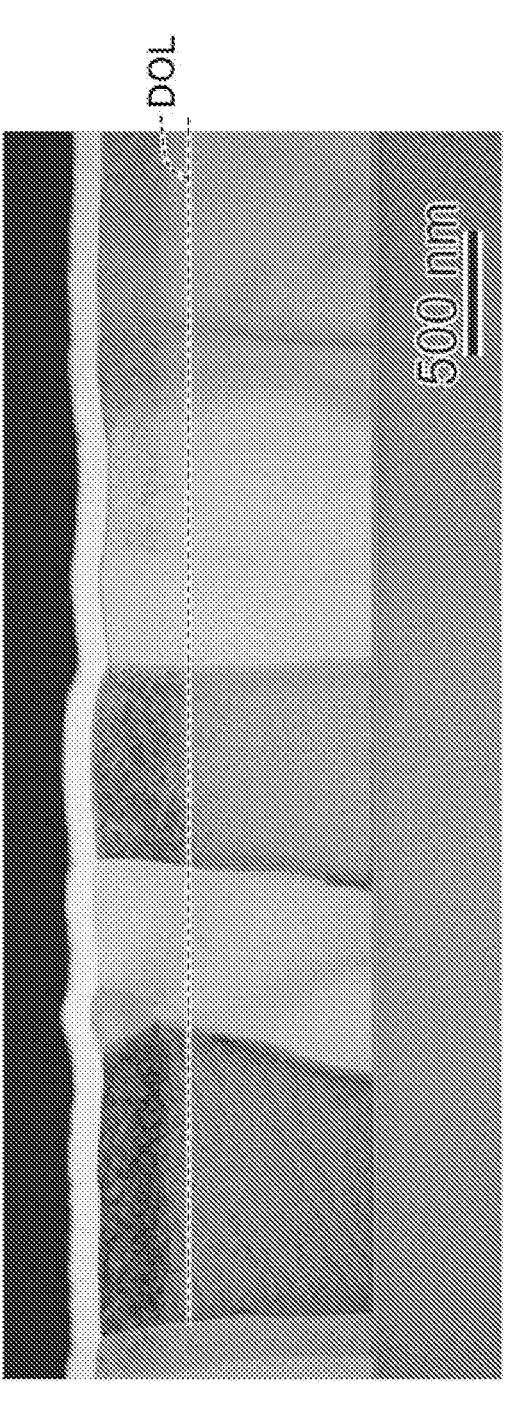
FIG. 10 is a cross-sectional view of a silicon implanted metal film.

As a result, as shown in FIG. 8, a dense point defect is not observed in the sample without the ion-implantation. In contrast, as shown in FIG. 9, in a sample in which aluminum is ion-implanted at an implantation energy 100 keV and a dose of $1\times10^{16}$ cm$^{-2}$, the point defects dense from the front surface of the metal film MF to a depth of 300 nm to 400 nm (dotted line DOL) are observed. Further, as shown in FIG. 10, even in a sample in which silicon is ion-implanted at an implantation energy 100 keV and a dose of $1\times10^{16}$ cm$^{-2}$, the point defects densely packed from the front surface of the metal film MF to the depth of 300 nm to 400 nm (dotted line DOL) are observed.

In addition, the inventor of the present disclosure performed annealing on samples of the metal film MF made of aluminum and copper and observed them cross section. Here, one sample is performed the ion-implantation and other sample is not performed the ion-implantation. The annealing is performed in an atmosphere of an inert gas at a heating temperature of 300 degrees Celsius. or higher and 400 degrees Celsius. or lower for a heating time of less than 2 hours.

Figure 11:
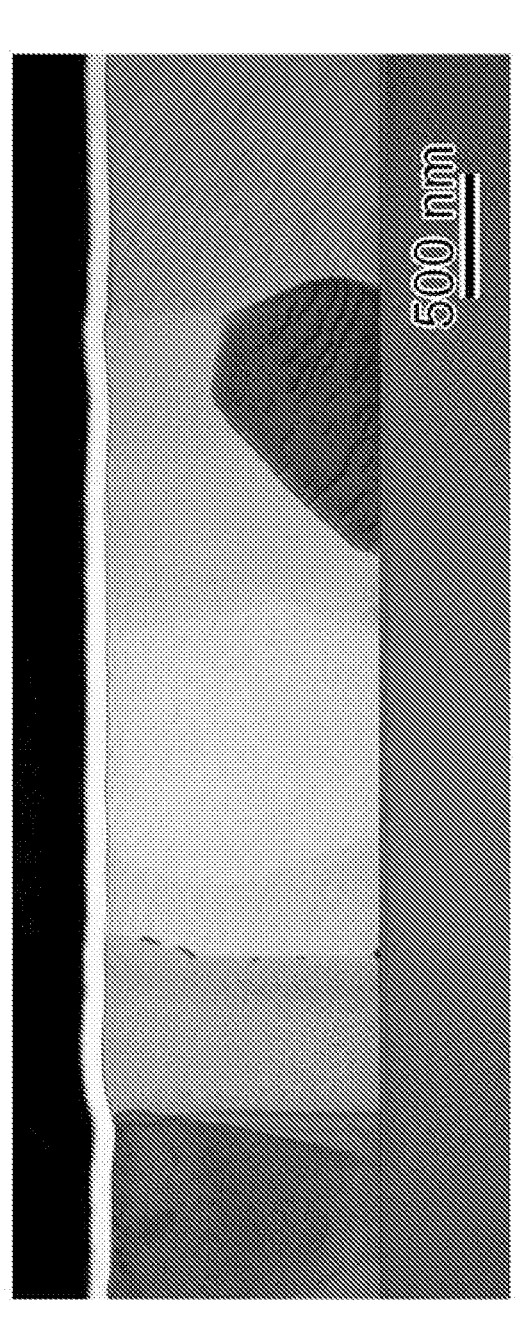
FIG. 11 is a cross-sectional view of a metal film according to a comparative embodiment annealed without ion-implantation.
Figure 12:
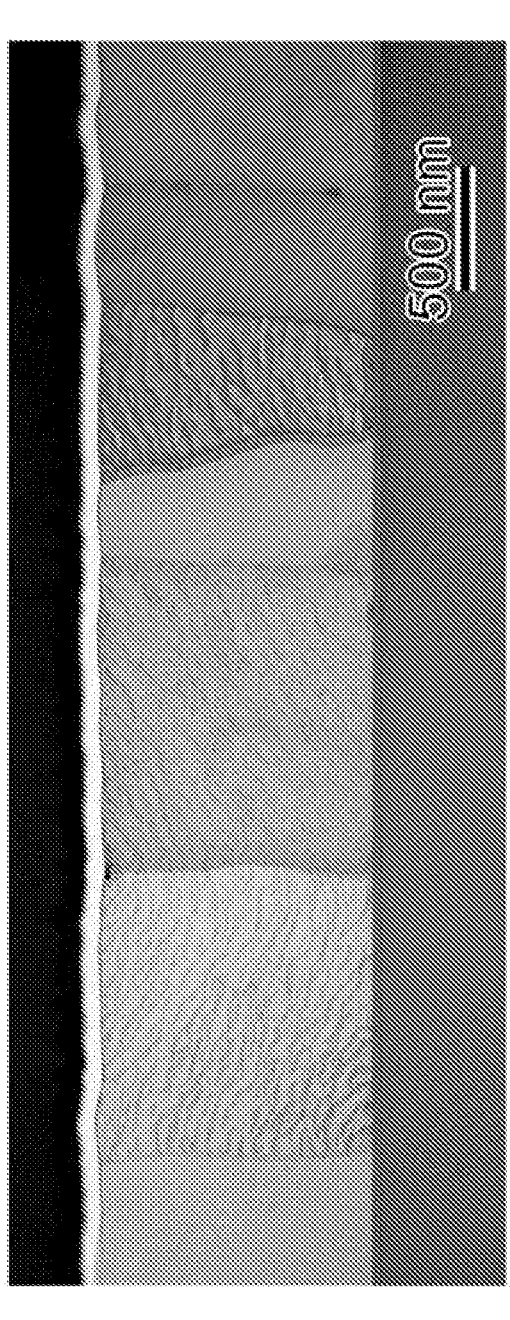
FIG. 12 is a cross-sectional view of the metal film annealed after ion-implantation with aluminum.

As a result, as shown in FIG. 11, in the sample in which the ion-implantation is not performed, although the dislocations are observed, it is found that the number of dislocation-generated metal crystal grains is extremely small. On the other hand, as shown in FIG. 12, in a sample in which aluminum is ion-implanted under the conditions of an implantation energy 180 keV and a dose of $1\times10^{16}$ cm$^{-2}$, the dislocations occurred in many metal crystal grains, and it is found that a dislocation density is higher than that in a sample in which the ion-implantation is not performed. In addition, as shown in FIG. 13, even in a sample in which silicon is ion-implanted under the conditions of a implantation energy 180 keV and a dose of $1\times10^{16}$ cm$^{-2}$, the dislocations occurred in many metal crystal grains, and it is found that the dislocation density is higher than that in a sample in which the ion-implantation is not performed.

Figure 13:
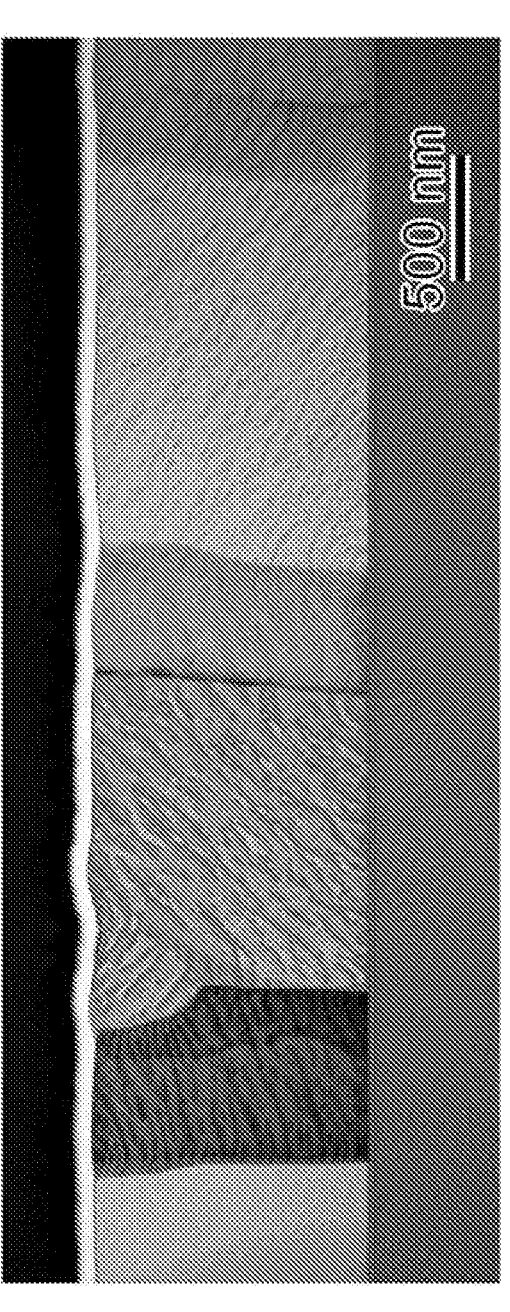
FIG. 13 is a cross-sectional view of the metal film annealed after ion-implantation with silicon.

Furthermore, in the sample in which the ion-implantation as shown in FIGS. 12 and 13 is performed, it is also found that the number of the metal crystal grains having the dislocations is larger than the number of the metal crystal grains having no dislocations.

And, the inventor of the present disclosure investigated the relationship between the presence or absence of the ion-implantation into the metal film MF and the relaxation of stress. The result is shown in FIG. 14.

Figure 14:
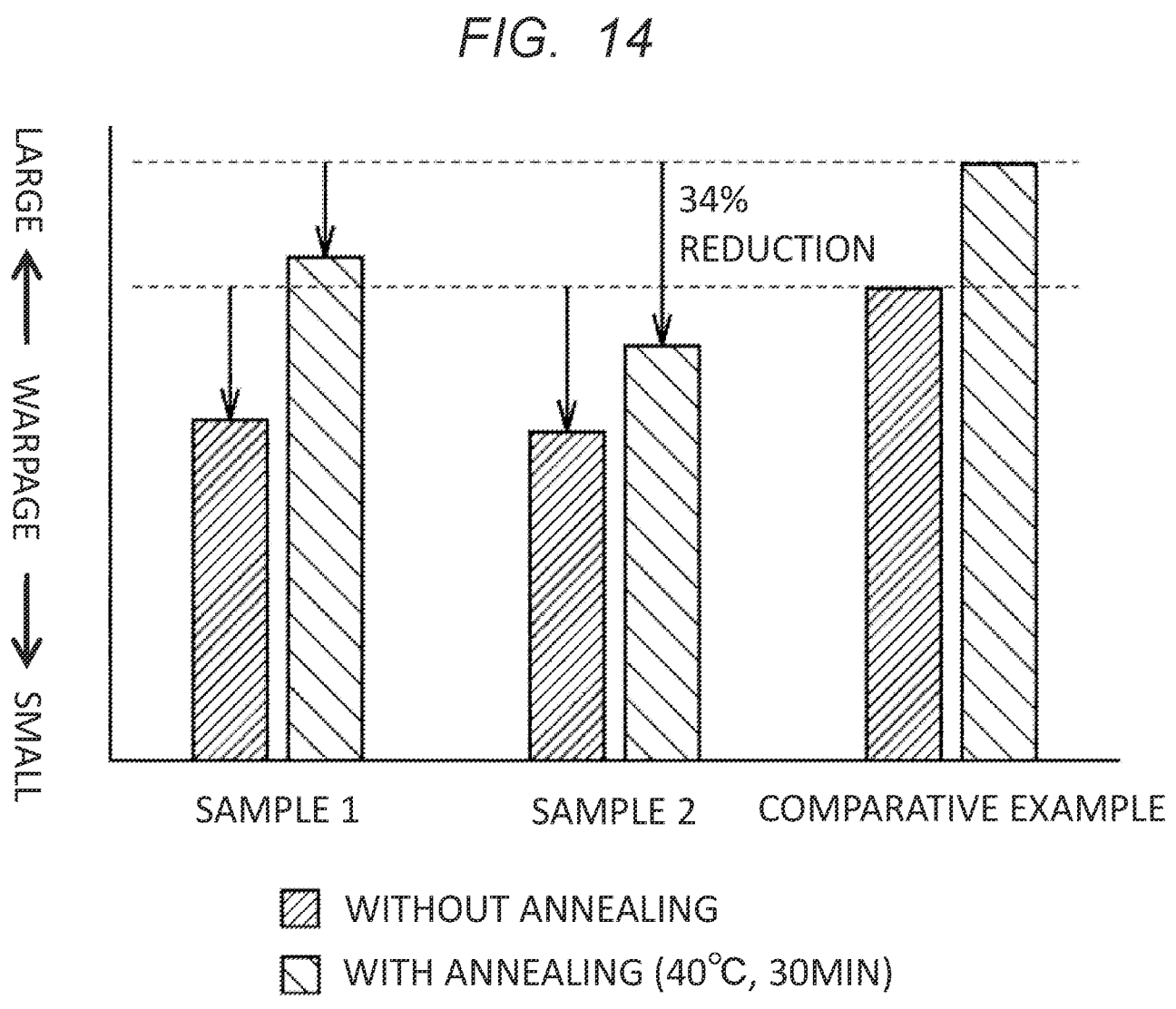

From the results of FIG. 14, it is found that warpages of the samples 1 and 2 in which ions are implanted into the metal film MF is smaller than that of the comparative example in which the ion-implantation is not performed in the metal film MF, and the inner stresses in the metal film MF are relaxed. In particular, it is found that the warpage in the sample 2 after annealing is 34% smaller than the warpage in the sample of the comparative example after annealing.

Note that each of sample 1, sample 2, and comparative example are the metal film MF made of aluminum deposited at a thickness of 1 micrometer by sputtering at 250 degrees Celsius. Sample 1 is a sample in which aluminum is ion-implanted at an implantation energy 180 keV and a dose of $1\times10^{16}$ cm$^{-2}$. Sample 2 is a sample in which silicon is ion-implanted at an implantation energy 180 keV and a dose of $1\times10^{16}$ cm$^{-2}$. Annealing is performed in an inert gas atmosphere at a heating temperature of 400 degrees Celsius. for a heating time of 30 minutes.

The inventor of the present disclosure also examined the dislocation density and hardness in Sample 1, Sample 2, and comparative example after annealing in FIG. 14. As a result, the sample of the comparative sample had a dislocation density of 28 particles/square micrometer and a hardness of 0.92 GPa. In contrast, Sample 1 had a dislocation density of 60 particles/square micrometer and a hardness of 0.96 GPa. In Sample 2 had a dislocation density of 75 particles/square micrometer and a hardness of 1.17 GPa.

In addition, the inventor of the present disclosure has confirmed that the crystal orientation and resistance of the metal film MF that has been annealed for recrystallization are equivalent to the crystal orientation and resistance of the metal film MF that has not been ion-implanted, and there is no practical problem.

The dislocation density is obtained by observing the cross section of the metal film MF by TEM (Transmission Electron Microscopy) and counting the number of the dislocations. The mean crystal grain size is obtained by observing the metal film MF from above by SEM (Scanning Electron Microscope) to determine the area of the crystal grain, and calculating the diameter of a perfect circle corresponding to the area.

As described above, the inventor of the present disclosure has found that high density dislocations occur in the metal film MF by introducing the point defects (vacancies V) by implanting the metal ions into the metal film MF and then performing annealing of recrystallization. The reason why the high density dislocations occurred is considered that, although, the metal film MF undergoes the plastic deformation due to annealing, the introduced the point defects (vacancies V) accelerate this plastic deformation and gathered in some crystal grains. Further, the inventor of the present disclosure have found that the crack resistance of wire bonding is improved by hardening the metal film MF by the high density dislocations to obtain high strength.

In the present embodiment, the number of the first metal crystal grains GR2, GR3 and GR4 having dislocations DL is larger than the number of the second metal crystal grains GR1 and GR5 having no dislocations DL. Therefore, the metal film MF has high strength, and the crack resistance of the wire bonding is improved.

In the present embodiment, the metal film MF is made of a material containing at least one selected from the group consisting of aluminum, tungsten, copper, cobalt, and nickel. As a result, the metal film MF can be applied to the wiring and the bonding pad. Note that, by using a material containing aluminum as the metal film MF, high crack resistance can be obtained in wire bonding.

In the present embodiment, the dislocations DL in each of the first metal crystal grains GR2, GR3 and GR4 is 60 dislocations/square micrometer or more. As a result, cracks are less likely to occur in wire bonding.

In the present embodiment, the mean crystal grain size of the plurality of metal crystal grains GR including the first metal crystal grains GR2, GR3 and GR4, and the second metal crystal grains GR1 and GR5 is 1 micrometer or more and 5 micrometers or less. When the mean crystal grain size is less than 1 micrometer, the grain boundaries become large and the electromigration resistance and the stress migration resistance become low. When the mean crystal grain size exceeds 5 micrometers, the hardness decreases.

In the present embodiment, the mean crystal grain size of the metal crystal grains GR is 1.7 micrometers or less. This improves the hardness.

Further, in the present embodiment, as shown in FIG. 1, the third metal crystal grains GRA are located in the grain boundaries GB of the plurality of metal crystal grains GR including the first metal crystal grains GR2, GR3 and GR4, and the second metal crystal grains GR1 and GR5. The third metal crystal grains GRA are located at the grain boundaries GB in this way, so that the metal element in the metal film MF is less likely to move. This improves electromigration resistance and stress migration resistance.

Further, in the present embodiment, each of the first metal crystal grains GR2, GR3 and GR4, and the second metal crystal grains GR1 and GR5 is made of a material containing aluminum, and the third metal crystal grains GRA are made of a material containing silicon or copper. Thus, the third metal crystal grains GRA can be precipitated at the grain boundaries of the plurality of metal crystal grains GR.

In addition, in the present embodiment, as shown in FIG. after the point defects (vacancies V) are introduced into the metal film MF, the metal crystal grains GR are recrystallized as shown in FIG. 6, whereby dislocations DL are generated in the metal film MF. As a result, the high-density dislocations can be generated, so that metal film MF has high strength, and the crack resistance of the wire bonding is improved.

Further, in the present embodiment, the step of introducing the point defects (vacancies V) into the metal film MF includes at least one of a step of implanting a metal-ion into the metal film MF and a step of irradiating the metal film MF with an electron-beam. As a result, the point defects (vacancies V) can be introduced into the metal film MF.

In addition, the wiring of aluminum is required to have a high electromigration resistance and a high stress migration resistance when a large current flows in the power device. In aluminum films formed by conventional sputtering, it is difficult to achieve both crack resistances, electromigration resistance, and stress migration resistance.

However, according to the present embodiment, as described above, it is easy to achieve both crack resistances, electromigration resistance, and stress migration resistance.

Although the invention made by the present inventor has been specifically described based on the embodiment, the present invention is not limited to the embodiment described above, and it is needless to say that various modifications can be made without departing from the gist thereof.

What is claimed is:

1. A metal film comprising:
a plurality of first metal crystal grains having dislocations and
a plurality of second metal crystal grains not having the dislocations, wherein
a number of the plurality of first metal crystal grains is greater than a number of the plurality of second metal crystal grains.

2. The metal film according to claim 1, wherein
the metal film made of a material containing at least one selected from a group consisting of aluminum, tungsten, copper, cobalt and nickel.

3. The metal film according to claim 1, wherein
a density of the dislocations of the plurality of first metal crystal grains is 60 particles/square micrometer or more.

4. The metal film according to claim 1, wherein
a mean crystal grain size of a plurality of metal crystal grains including the plurality of first metal crystal grains and the plurality of second metal crystal grains is 1 micrometer or more and 5 micrometers or less.

5. The metal film according to claim 4, wherein
the mean crystal grain size of the plurality of metal crystal grains is 1.7 micrometers or less.

6. The metal film according to claim 1, further comprising:
a plurality of third metal crystal grains located on grain boundaries between first metal crystal grains, between second metal crystal grains, or between first metal crystal grain and second metal crystal grain, wherein
the plurality of third metal crystal grains made of a different material of the plurality of first metal crystal grains and the plurality of second metal crystal grains.

7. The metal film according to claim 6, wherein
the plurality of first metal crystal grains and the plurality of second metal crystal grains made of a material containing aluminum and
the plurality of third metal crystal grains made of a material containing silicon or copper.

8. A semiconductor device comprising:
a metal film including a plurality of first metal crystal grains each having dislocations and a plurality of second metal crystal grains each not having the dislocations, wherein
a number of the plurality of first metal crystal grains is greater than a number of the plurality of second metal crystal grains, and
the metal film is comprised as a bonding pad or a wiring.

* * * * *